United States Patent [19]
Ahn et al.

[11] Patent Number: 6,121,126
[45] Date of Patent: Sep. 19, 2000

[54] METHODS AND STRUCTURES FOR METAL INTERCONNECTIONS IN INTEGRATED CIRCUITS

[75] Inventors: Kie Y. Ahn, Chappaqua, N.Y.; Leonard Forbes, Corvallis, Oreg.; Paul A. Farrar, S. Burlington, Vt.

[73] Assignee: Micron Technologies, Inc., Boise, Id.

[21] Appl. No.: 09/030,430

[22] Filed: Feb. 25, 1998

[51] Int. Cl.$^7$ ................................................ A01L 21/28
[52] U.S. Cl. ........................ 438/602; 438/46; 438/619; 438/752; 438/688; 438/770; 438/779
[58] Field of Search .................. 438/688, 85, 46, 438/602, 660, 658, 752, 770, 779, 796, 619, 618; 257/765, 771, 743, 542

[56] References Cited

U.S. PATENT DOCUMENTS

| | | | |
|---|---|---|---|
| 4,702,941 | 10/1987 | Mitchell et al. | 427/250 |
| 4,959,705 | 9/1990 | Lemnious | 257/522 |
| 5,148,260 | 9/1992 | Inoue et al. | 257/276 |
| 5,187,560 | 2/1993 | Yoshida et al. | 257/743 |
| 5,324,684 | 6/1994 | Kermani et al. | 437/95 |
| 5,341,016 | 8/1994 | Prall et al. | 257/412 |
| 5,371,035 | 12/1994 | Pfiester et al. | 437/69 |
| 5,470,801 | 11/1995 | Kapoor et al. | 437/238 |
| 5,510,645 | 4/1996 | Fitch et al. | 257/522 |
| 5,563,448 | 10/1996 | Lee et al. | 257/742 |

(List continued on next page.)

OTHER PUBLICATIONS

Cherkasov, Y.A., et al., "Optical information media based on an amorphous photoconductor with high avalanche amplification—the amorphous analog of trigonal selenium", *Journal of Optical Technology*, vol. 64, No. 7, 627–32, (Jul. 7, 1997).

Shuto, S., et al., "Read Disturb Degradation Mechanism for Source Erase Flash Memories", *1996 Symposium on VLSI Technology, Digest of Technical Papers*, Honolulu, HI, 242–43, (1996).

Berezhnoi, A., *Silicon and its Binary Systems*, Consultants Bureau, New York, 84, (1960).

Fukuda, Y., et al., "A New Fusible–Type Programmable Element Composed of Aluminum and Polysilicon", *IEEE Trans. on Electron Devices, ED–33*, 250–253, (Feb., 1986).

Hanna, J., et al., "Early Stage of Polycrystalline Growth of Ge and SiGe by Reactive Thermal CVD from GeF(4) and Si(2)H(6)", *Materials Res. Soc. Symp. Proc., 358*, Boston, MA, 877–881, (Nov./Dec., 1994).

Hansen, P., *Constitution of Binary Alloys*, McGraw–Hill, New York, 103, (1958).

Hiraki, A., et al., "Formation of Silicon Oxide over Gold Layers on Silicon Substrates", *J. Applied Physics, 43*, 3643–3649, (Sep., 1972).

(List continued on next page.)

*Primary Examiner*—John F. Niebling
*Assistant Examiner*—Ha Tran Nguyen
*Attorney, Agent, or Firm*—Schwegman, Lundberg, Woessner & Kluth, P.A.

[57] ABSTRACT

A typical integrated-circuit fabrication requires interconnecting millions of microscopic transistors and resistors with metal wires. Making the metal wires flush, or coplanar, with underlying insulation requires digging trenches in the insulation, and then filling the trenches with metal to form the wires. Trench digging is time consuming and costly. Accordingly, the invention provides a new "trench-less" or "self-planarizing" method of making coplanar metal wires. Specifically, one embodiment forms a first layer that includes silicon and germanium; oxidizes a region of the first layer to define an oxidized region and a non-oxidized region; and reacts aluminum or an aluminum alloy with the non-oxidized region. The reaction substitutes, or replaces, the non-oxidized region with aluminum to form a metallic wire coplanar with the first layer. Another step removes germanium oxide from the oxidized region to form a porous insulation having a very low dielectric constant, thereby reducing capacitance. Thus, the present invention not only eliminates the timing-consuming, trench-digging step of conventional methods, but also reduces capacitance which, in turn, enables faster, more-efficient integrated circuits.

28 Claims, 3 Drawing Sheets

U.S. PATENT DOCUMENTS

| | | | |
|---|---|---|---|
| 5,710,454 | 1/1998 | Wu | 257/413 |
| 5,757,072 | 5/1998 | Gorowitz et al. | 257/522 |
| 5,796,151 | 8/1998 | Hsu et al. | 257/410 |
| 5,796,166 | 8/1998 | Agnello et al. | 257/751 |
| 5,801,444 | 9/1998 | Aboelfotah et al. | 257/742 |
| 5,925,918 | 7/1999 | Wu et al. | 257/413 |
| 5,942,799 | 8/1999 | Danek et al. | 257/751 |

OTHER PUBLICATIONS

Hiraki, A., et al., "Low–Temperature Migration of Silicon in Metal Films on Silicon Substrates Studiedby Backscattering Techniques", *J. Vacuum Science and Tech., 9*, 155–158, (Jan./Feb., 1972).

Horie, H., et al., "Novel High Aspect Ratio Aluminum Plug for Logic/DRAM LSI's Using Polysilicon–Aluminum Substitute", *Technical Digest: IEEE Int. Electron Devices Meeting*, San Francisco, CA, 946–948, (1996).

Hurley, P., et al., "Low Temperature Plasma Oxidation of Polycrystalline Silicon", *Proc. 7th European Conf. on Insulating Films on Semiconductors: Contributed Papers, Section 5*, IOP Publishing Ltd., 235–238, (1991).

Hwang, J., et al., "Novel Polysilicon/TiN Stacked–Gate Structure for Fully–Depleted SOI/CMOS", *Technical Digest: Int. Electron Devices Meeting*, San Francisco, CA, 345–348, (Dec. 1992).

King, T., et al., "Deposition and Properties of Low–Pressure Chemical–Vapor Deposited Polycrystalline Silicon–Germanium Films", *J. Electrochemical Society, 141*, 2235–2241, (Aug. 1994).

Lee, D.H., et al., "Gate Oxide Integrity (GOI) of MOS transistors with W/TiN stacked gate", *1996 Symposium on VLSI Technology Digest of Technical Papers*, 208–209, (1996).

Li, C., et al., "Low Temperature Heteroepitaxial Growth of $Si(1-x)Ge(x)$–on–Si by Photo–Enhanced Ultra High Vacuum Chemical Vapor Deposition Using $Si(2)H(6)$ and $Ge(2)H96)$", *J. Electronic Materials, 24*, 875–884, (Jul. 1995).

Li, P., et al., "Formation of Stoichiometric SiGe Oxide by Electron Cyclotron Resonance Plasma", *Appl. Phys. Lett, 60*, 3265–3267, (Jun. 1992).

Lyman, T.e., "Metallography, Structure and Phase Diagrams", *Metals Handbook, 8*, American Society for Metals; Metals Park, Ohio, 253, 256, 260, 263,, (1989).

Moffatt, W., *The Handbook of Binary Phase Diagrams*, General Electric Company, pub., vol. 1, 3/84, (1978).

Mohajerzadeh, S., et al., "A Low Energy Ion Beam Assisted Deposition Technique for Realizaing iso–type SiGe/Si hetero–interface diodes", *Thin Solid Films, 283*, 182–187, (1996).

Mohajerzadeh, S., et al., "A Low–Temperature Ion Vapor Deposition Technique for Silicon and Silicon–Germanium Epitaxy", *Canadian J. Physics, 74*, S69–S73, (1996).

Mohri, M., et al., "Effect of $SiF(4)/SiH(4)/H(2)$ Flow Rates on Film Properties of Low–Temperature Polycrystalline Silicon Films Prepared by Plasma Enhanced Chemical Vapor Deposition", *IEICE Transactions on Electronics, E77–C*, 1677–1684, (Oct. 1994).

Mukhopadhyay, M., et al., "Properties of SiGe Oxides Grown in a Microwave Oxygen Plasma", *J. Applied Physics, 78*, 6135–6140, (Nov. 1995).

Predel, B., et al., "Die Zustandsdiagramme Silber–Germanium–Silizium und Gold–Germanium–Silizium", *J. Less–Common Metals, 44*, 39–49, (Jan. 1976).

Schadel, H., et al., "Activity of Liquid Silver–Silicon Alloys", *Trans. American Institute of Mining and Metallurgical Engineers, 188*, 1282–1283, (Oct. 1950).

Ushiku, Y., et al., "Planarized Silver Interconnect Technology with a Ti Self–Passivation Technique for Deep Sub–Micron ULSIs", *1993 Symp. on VLSI Technology: Digest of Technical Papers*, 121–122, (1993).

Wu, S., et al., "Suppression of the Boron Penetration Induced Si/SiO2 Interface Degradation by Using a Stacked–Amorphous–Silicon Film as the Gate Structure for pMOSFET", *IEEE Electron Device Letters, 15*, 160–162, (May 1994).

METHODS AND STRUCTURES FOR METAL INTERCONNECTIONS IN INTEGRATED CIRCUITS

BACKGROUND OF THE INVENTION

The present invention concerns methods of making, or fabricating, integrated circuits, particularly methods of forming interconnects.

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then "wired," or interconnected, together to define a specific electric circuit, such as a computer memory.

Interconnecting millions of microscopic components typically entails covering the components with an insulative layer, etching small holes in the insulative layer to expose portions of the components underneath, and then actually connecting the components through metallization. Metallization is the process of depositing a metal, usually an aluminum alloy, into the small holes and onto the insulative layer to form line-like, metallic paths, or wires, between the components. Photolithography, an optical-patterning technique, defines the particular wiring or interconnection pattern.

Frequently, several levels of metallization, sometimes as many as six or seven, are necessary to make a particular circuit. Such cases require covering each metallization level with insulation, etching holes to expose portions of an underlying metallization, and then depositing more metal to form additional wires, connecting the exposed portions of the underlying metallization.

Current interconnection techniques suffer from two significant shortcomings. First, because of limitations in the photolithography used to define metallization patterns, current techniques require digging trenches to ensure that deposited metallic lines are flush, or coplanar, with the surface of the underlying insulation. However, digging these trenches is a time-consuming step which ultimately increases the cost of manufacturing integrated circuits.

Secondly, current techniques yield interconnective structures of insulation and metal that are highly capacitive. High capacitance wastes power and slows the response of integrated circuits to electrical signals. Thus, current interconnection techniques stand in the way of faster and more-efficient integrated circuits.

Accordingly, there is not only a need for new interconnection methods that eliminate the trench-digging step, but also a need for new methods and interconnective structures that yield faster and more-efficient integrated circuits.

SUMMARY OF THE INVENTION

To address these and other needs, the present invention provides a new method of making coplanar metallic and insulative members for an integrated circuit. Specifically, one embodiment of the method entails forming a first layer that includes silicon and germanium, and then oxidizing a region of the first layer to define an oxidized region and a non-oxidized region. After oxidation, the method reacts aluminum or an aluminum alloy with the non-oxidized region. The reaction substitutes, or replaces, the non-oxidized region with aluminum alloy to form a metallic member flush or coplanar with the first layer. Another step removes germanium oxide from the oxidized region to form a porous insulative member having a low dielectric constant.

Thus, the method of the present invention yields a self-planarizing metallic structure that not only eliminates the time-consuming, trench-digging step of conventional methods, but also places the metallic structure within a low-dielectric insulation that allows faster, more-efficient integrated circuits.

BRIEF DESCRIPTION OF THE DRAWINGS

The following figures are used to describe many aspects of the invention.

DESCRIPTION OF THE PREFERRED EMBODIMENTS

The following detailed description, which references and incorporates FIGS. 1–10, describes and illustrates specific embodiments of the invention. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

The detailed description includes two sets of separate but overlapping embodiments of the invention. The first set of embodiments, illustrated principally with FIGS. 1–8, pertains to a preferred method of making single- and multi-level interconnective structures. The second set of embodiments, illustrated principally with FIGS. 9 and 10, concern hybrid interconnect structures which combine air bridges with structures exemplified in the first set of embodiments.

Preferred Method of Making Single- and Multi-Level Interconnects

Figure 1:
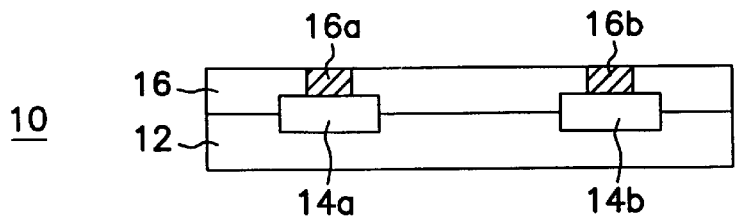
FIG. 1 is a cross-sectional view of an integrated-circuit assembly.

FIGS. 1–8 show a number of preferred integrated-circuit assemblies, which taken collectively and sequentially, illustrate the preferred method of the present invention. The method, as shown in FIG. 1, begins with a known integrated-circuit assembly or structure 10. Assembly 10 includes a substrate 12 which supports a number of integrated elements 14, preferably transistors 14a and 14b. (The term "substrate" encompasses semiconductor wafers as well as structures having one or more insulative, conductive, or semiconductive layers and materials, for example, silicon-on-insulator or silicon-on-sapphire structures.) Transistors 14a and 14b are covered by an insulative layer 16, which preferably comprises silicon oxide, nitride, or oxynitride. Layer 16 includes two aluminum vias 16a and 16b electrically connected to respective transistors 14a and 14b.

Figure 2:
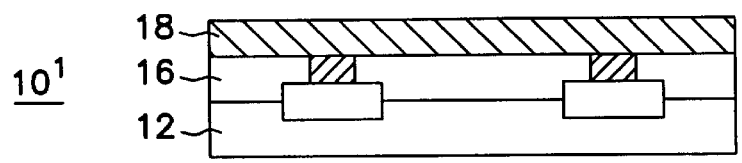
FIG. 2 is a cross-sectional view of the FIG. 1 integrated-circuit assembly after formation of silicon-germanium layer.

Next, as FIG. 2 shows, the preferred method forms a polycrystalline, silicon-germanium (SiGe) layer 18 on insulative layer 16 and over vias 16a and 16b. In the preferred embodiment, silicon-germanium layer 18 is approximately one micron thick, and comprises between 10 and 40 percent germanium. The layer is formed through conventional low-pressure chemical-vapor deposition (LP-CVD), specifically the pyrolysis of silicon hydride ($SiH_4$) and germanium hydride ($GeH_4$) gases at a temperature as low as 400° C. For more details on this technique, which controls the silicon-germanium composition by varying the gas flow rates, refer to the T. J. King article, entitled "Deposition and Properties of Low-Pressure Chemical-Vapor Deposited Polycrystalline Silicon-Germanium Films," in the Journal of the Electro-Chemical Society (pp. 2235–41, August 1994). This article is incorporated by reference.

Deposition temperatures lower than 400° C. are possible through plasma-enhanced chemical-vapor deposition. The silicon-germanium film can also be grown using other gases, such as germanium fluoride ($GeF_4$). See, for example, the J. I. Hanna article entitled "Early Stage of Polycrystalline Growth of Ge and SiGe by Reactive Thermal CVD from $GeF_4$ and $Si_2H_6$ (Microcrystalline and Nanocrystalline Semiconductors Symposium, Boston 1994, pp. 877–881, 1995), which is incorporated herein by reference.

Figure 3A:
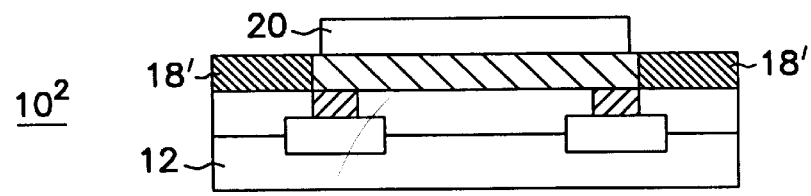
FIG. 3A is a cross-sectional view of the FIG. 2 integrated-circuit assembly after formation of an oxidation mask.
Figure 3B:
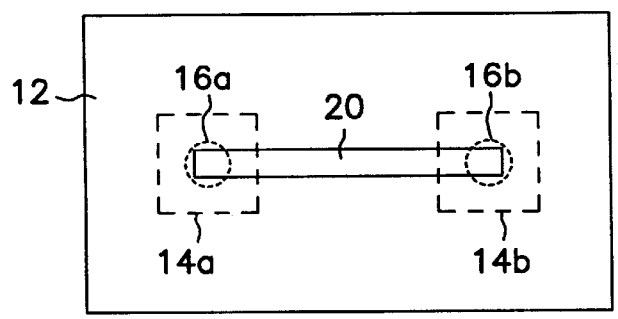
FIG. 3B is a top view of the FIG. 3A integrated-circuit assembly, showing the oxidation mask.

In FIG. 3A, the method forms an oxidation mask 20 on silicon-germanium layer 18. This mask defines a narrow, rectangular channel which ultimately defines the periphery of a conductor connecting vias 16a and 16b and thus transistors 14a and 14b. A top view of mask 20 and its relation to transistors 14a and 14b and vias 16a and 16b is shown in FIG. 3B.

To form mask 20, the method deposits a layer of silicon nitride ($Si_3N_4$), using low-pressure or plasma-enhanced chemical-vapor deposition. Conventional lithographic techniques define the mask, finally formed through reactive-ion or plasma etching of the silicon-nitride layer. The actual mask thickness, which preferably ranges between 30 and 100 nanometers, depends on the etchant used to remove the unwanted silicon nitride.

After completion of mask 20, the method oxidizes silicon-germanium layer 18. This oxidization defines regions under mask 20 as non-oxidized regions and unmasked regions as oxidized regions. The oxidized regions contain an extractable or removable germanium oxide, which can be removed to leave a porous insulator having a low dielectric constant. The non-oxidized regions eventually become the metallic or conductive member connecting transistors 14a and 14b. In the preferred embodiment, the oxidation is plasma enhanced to occur at temperatures below 200° C. The results of oxidation are shown as regions 18' in FIG. 3A.

Figure 4:
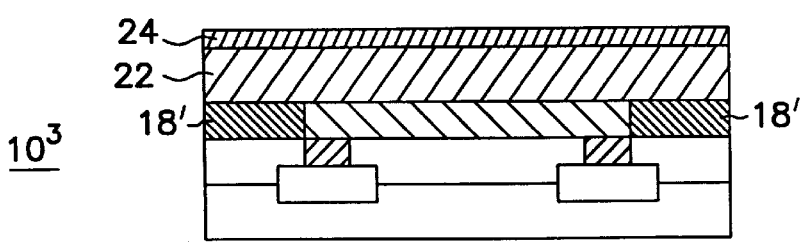
FIG. 4 is a cross-sectional view of the FIG. 3 integrated-circuit assembly after removal of the oxidation mask and formation of an aluminum alloy layer and a titanium layer.
Figure 5:
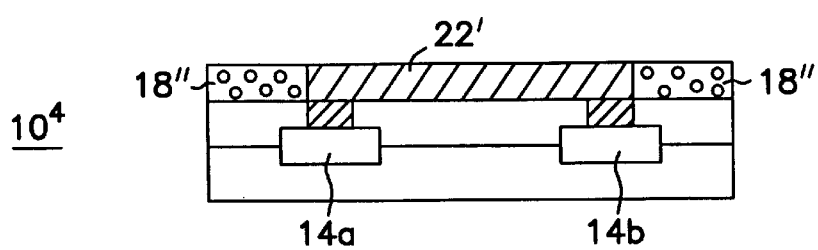
FIG. 5 is a cross-sectional view of the FIG. 4 assembly after reaction of the aluminum alloy layer and the silicon-germanium layer.

In FIG. 4, the method entails removing mask 20, preferably through chemical etching or chemical-mechanical polishing, to leave silicon-germanium layer 18 with a planar surface. Afterward, physical or chemical vapor deposition forms a 1.5-micron-thick, metal layer 22 on the oxidized and non-oxidized regions of layer 18. In the preferred embodiment the metal is an aluminum alloy that includes 0.3 to 4.0 percent copper (Al—Cu), but in another embodiment, the aluminum alloy also includes 0.3 to 1.6 percent silicon. The copper and silicon additions reduce electro-migration of the aluminum at high current levels.

Next, the method forms a 200-nanometer-thick, titanium layer 24 on layer 22 by physical vapor deposition. In other embodiments, layer 24 is between 500 and 2500 Angstroms thick and comprises zirconium or hafnium, instead of titanium. Layer 24, which is optional, reduces the temperature and time necessary to complete the next step.

The next step forces a metal-substitution reaction between metal layer 22 and the non-oxidized, or desired metallic, regions of silicon-germanium layer 18. To force this reaction, the method heats or anneals the integrated-circuit assembly to 400° C. in a nitrogen, forming gas, or other non-oxidizing atmosphere for approximately 60 minutes. The substitution temperature, that is, the annealing temperature, should be lower than the eutectic (lowest melting) temperature of the ternary aluminum-silicon-germanium system for the reaction or substitution to occur. Heating urges or causes diffusion or dissolution of the non-oxidized regions of metal layer 22 into silicon-germanium layer 18 and silicon-germanium into the metal layer, ultimately substituting the non-oxidized regions of silicon-germanium layer 18 with metal from metal layer 22, an aluminum-copper alloy in the preferred embodiment. Consequently, a coplanar metallic structure 22', consisting essentially of metal from layer 22 with small amounts of silicon and germanium, forms in silicon-germanium layer 18. Thus, unlike conventional techniques that require trench-digging (or other pre-metallization steps) to promote co-planarity of deposited metallic structures and underlying insulative structures, the present method is "self-planarizing" or "self-trenching."

After the reaction, a small amount of germanium may remain on metallic structure 22'. Additionally, any metal from metal layer 22 that remains on the surface of layer 18, such as an aluminum alloy of the preferred embodiment, may contain titanium silicide and silicon-germanium agglomerates. These are removed by chemical-mechanical polishing or other suitable techniques.

Finally, to reduce the dielectric constant of oxidized regions 18', germanium oxide in the oxidized regions of silicon-germanium layer 18 is removed using a wet etchant, such as distilled or deionized water. This leaves a porous oxide, insulative structure with a low dielectric constant which ultimately reduces capacitance and allows a faster, more efficient integrated circuit. The porous oxide regions are designated 18.

Figure 6A:
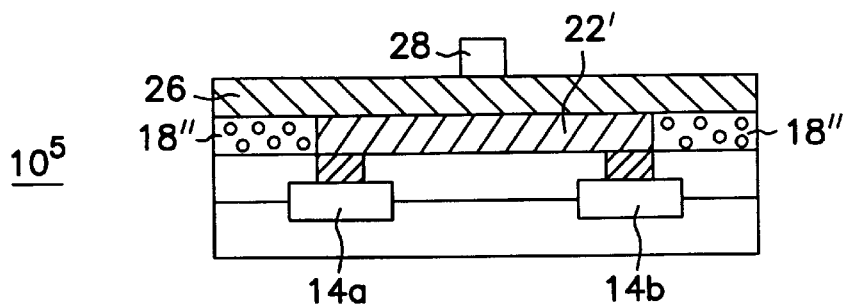
FIG. 6A is a cross-sectional view of the FIG. 5 integrated-circuit assembly after formation of a silicon-germanium layer and an oxidation mask.
Figure 6B:
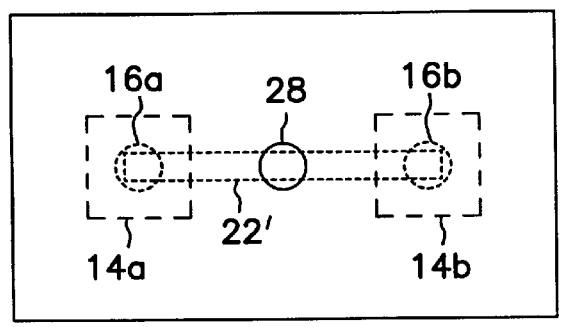
FIG. 6B is a top view of the FIG. 6A integrated-circuit assembly, showing the oxidation mask.

Further fabrication of more interconnection or metallization levels would entail repeating the steps already described and illustrated. For example, to form a second level that includes a via, the preferred embodiment, as illustrated in FIG. 6A, forms a second silicon-germanium layer 26 and then an oxidation mask 28 defining the size, shape, and position of the via relative conductor 22'. FIG. 6B shows a top view of the mask and its position relative conductor 22'.

Figure 7:
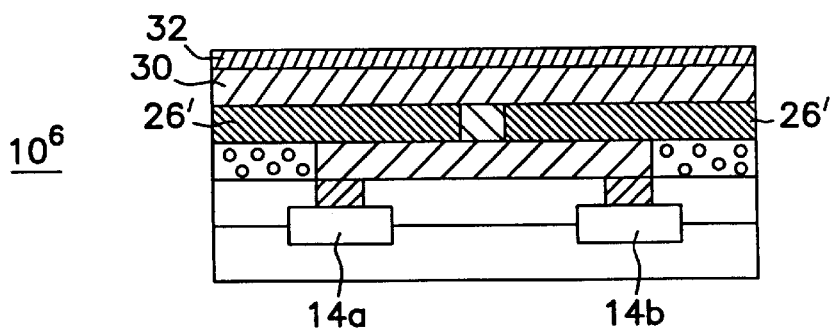
FIG. 7 is a cross-sectional view of the FIG. 6 integrated-circuit assembly after oxidation, removal of the oxidation mask, and formation of an aluminum alloy layer and a titanium layer.

After oxidizing the silicon-germanium layer 26 and then removing oxidation mask 28, the method forms a second metal (aluminum-alloy) layer 30 and a second titanium layer 32 as shown in FIG. 7. The integrated-circuit assembly is then heated to force the metal-substitution reaction, thereby substituting a portion of metal layer 30 for the non-oxidized portion of layer 26, forming a substantially coplanar via 30' (shown in FIG. 8). Notably, this technique, unlike conventional techniques that require forming an insulative layer, etching holes to define the vias, and then finally filling these holes with metal to form the vias, proceeds without etching and filling holes. Thus, the present invention provides an "etchless" or "hole-less" method of forming vias.

Figure 8:
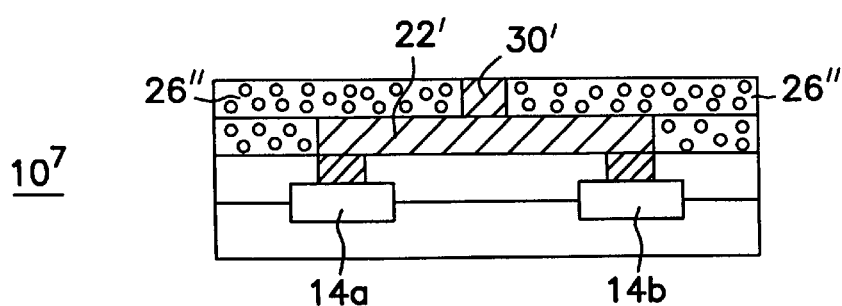
FIG. 8 is a cross-sectional view of the FIG. 7 assembly after reaction of the aluminum alloy layer and the silicon-germanium layer.

After, forming via 30', wet etching removes germanium oxide from regions 26' to form porous low-dielectric insulation 26" around via 30'. The resulting integrated-circuit assembly is depicted in FIG. 8. Subsequent metallizations would follow similarly.

With completion of the desired number of metallization levels, the preferred method ultimately concludes by heat-treating the integrated circuit for one to six hours at a temperature between 100 and 200° C. This heat treatment, which preferably occurs after packaging the integrated circuit in a protective housing, ensures that the metallic structures have minimum resistivity.

Preferred Hybrid Interconnects Incorporating Low-Capacitance Air Bridges

Figure 9:
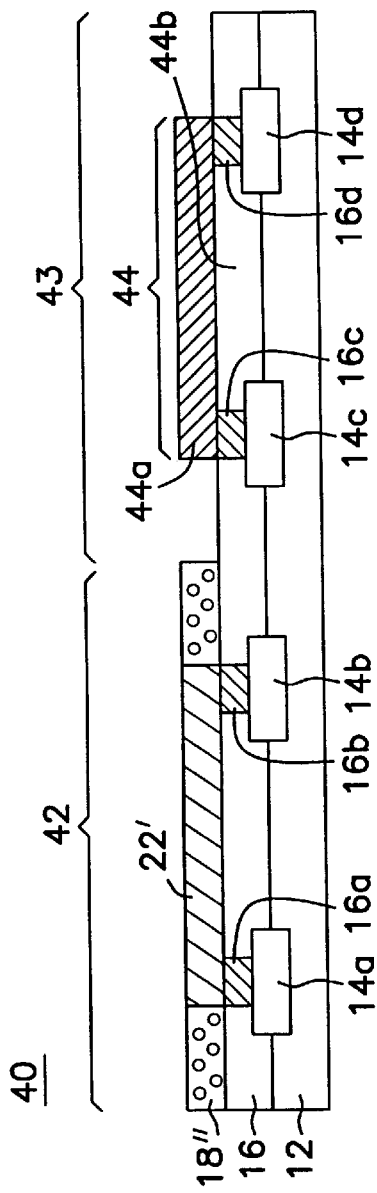
FIG. 9 is a cross-sectional view of an integrated-circuit assembly embodying a coplanar hybrid interconnect system.
Figure 10:
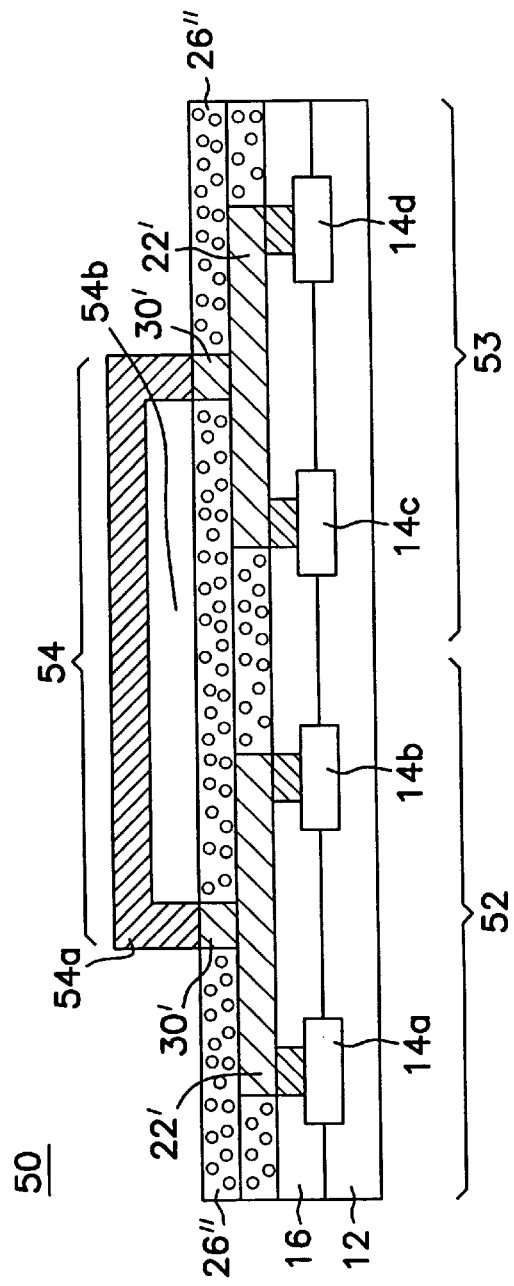
FIG. 10 is a cross-sectional view of an integrated-circuit assembly embodying a two-level (non-coplanar) hybrid interconnect system.

FIGS. 9 and 10 show two integrated-circuit assemblies which respectively combine the low-capacitance structures of FIGS. 3 and 8 with low-capacitance air bridges to yield new hybrid structures. In particular, FIG. 9 shows an integrated-circuit assembly 40 embodying a coplanar hybrid interconnect system which combines two distinct types of low-capacitance interconnect structures: a first interconnect structure 42 (on the left), and a second interconnect structure 43 (on the right). Structure 42, identical to the previously described structure of FIG. 3, connects transistors 14a and 14b on substrate 12 via conductive vias (or contacts) 16a and 16b and aluminum conductor 22'. For reduced capacitance, conductor 22' is embedded in porous insulation 18" which has a low dielectric constant. Structure 42 is preferably formed as detailed through the above description of FIGS. 1–3.

Interconnect structure 43 comprises an air bridge 44, which in turn comprises an aluminum conductor 44a and air cavity 44b. Conductor 44a, which is substantially coplanar to conductor 22', electrically connects vias 16c and 16d and thus electrically connects corresponding transistors 14c and 14d. The presence of air cavity 44b, which has a unity or near-unity dielectric constant lower than even that of porous insulation 18", minimizes line capacitance between these transistors.

Air bridge 44 is built conventionally by forming conductor 44a on an underlying, sacrificial support structure (not shown) and then removing the support structure to leave air cavity 44b. In conventional processing, the sacrificial support structure consists of photoresist or other material which can be easily dissolved or etched away. For further details on this known process, see U.S. Pat. No. 5,510,645 entitled Semiconductor Structure Having an Air Bridge and Method of Forming the Semiconductor Structure and U.S. Pat. No. 5,324,684 entitled Method of Forming Semiconductor Structure Having an Air Region, both issued to Fitch et al. and both incorporated herein by reference.

Fabrication of air bridge 44 may occur before, after, or concurrent with the fabrication of structure 42. For example, vias 16c and 16d may be formed simultaneous with vias 16a and 16b or started during the metal substitution reaction that forms conductor 22'. However, one should take care to avoid exceeding the substitution temperature; otherwise undesired substitution of aluminum may occur.

FIG. 10 shows an integrated-circuit assembly 50 embodying a two-level (non-coplanar) hybrid interconnect system which, like assembly 40, combines two types of low-capacitance interconnect structures. Assembly 50 includes an air bridge 54 which connects integrated-circuit assemblies 52 and 53. Assemblies 52 and 53, both of which are structurally identical to the previously described assembly of FIG. 8, embed aluminum conductors 22' in porous insulation 26". Conductors 22" are connected to vias 30', which are electrically connected via air bridge 54.

Air bridge 54 comprises aluminum conductor 54a and air cavity 54b. Conductor 54a, which occupies a plane above that of conductors 22', electrically connects vias 30' and thus electrically connects transistors 14a and 14b to transistors 14c and 14d. Air bridge 54 as well as assemblies 52 and 53 are fabricated according the methods described above.

Conclusion

The present invention overcomes at least two significant shortcomings of previous interconnection techniques. First, unlike previous techniques that require digging trenches in an insulative layer before metallization to ensure a coplanar metallic structure, the present invention provides a self-planarizing metallization process, which substitutes metal for select portions of an insulative layer, thereby skipping the time-consuming trench-digging step. Relatedly, the invention forms vias without the conventional steps of etching and filling holes with metal.

Secondly, unlike previous techniques which yielded highly-capacitive interconnective structures, the present invention puts metallic structures in a low-dielectric insulator to form low-capacitance structures which permit integrated circuits to operate with greater speed and economy.

The embodiments described above are intended only to illustrate and teach one or more ways of practicing or implementing the present invention, not to restrict its breadth or scope. The scope of the invention, intended to encompass all ways of practicing or implementing the invention, is defined only by the following claims and their equivalents.

What is claimed is:

1. A method of making a metallic structure, the method comprising:

forming a first layer including silicon and germanium;

oxidizing a region of the first layer to define an oxidized region and a non-oxidized region; and substituting metal for at least a portion of the non-oxidized region to form the metallic structure.

2. The method of claim 1, wherein forming the first layer comprises depositing a silicon alloy having between 10 and 40 percent germanium.

3. The method of claim 1, wherein forming the first layer comprises pyrolysis of silicon hydride and germanium hydride.

4. The method of claim 1, wherein oxidizing a region of the first layer comprises forming a mask structure on the first layer.

5. The method of claim 1, wherein the metal comprises an aluminum alloy.

6. The method of claim 1, wherein substituting metal for at least a portion of the non-oxidized region comprises:

urging diffusion of metal into the non-oxidized region.

7. The method of claim 6, wherein urging diffusion of metal into the non-oxidized region comprises:

forming a metal layer on the non-oxidized region of the first layer; and heating the metal layer.

8. The method of claim 1, wherein substituting metal for at least a portion of the non-oxidized region comprises:

forming a layer including aluminum on the non-oxidized region of the first layer; and heating the layer including aluminum.

9. The method of claim 8, wherein heating the layer including aluminum comprises:

increasing its temperature to a temperature less than but close to the eutectic temperature of a material system comprising aluminum, silicon, and germanium.

10. The method of claim 9, wherein heating the layer including aluminum occurs in a nitrogen, forming gas, or other non-oxidizing atmosphere.

11. The method of claim 10, further comprising forming a layer including titanium, zirconium, or hafnium on the layer including aluminum.

12. The method of claim 1, further comprising reducing the dielectric constant of the oxidized region.

13. The method of claim 12, wherein reducing the dielectric constant of the oxidized region comprises removing germanium oxide from the oxidized region.

14. The method of claim 1, further comprising:

heating the metallic structure to a predetermined temperature for a predetermined amount of time to reduce its electrical resistivity.

15. A method of making coplanar metallic and insulative structures, the method comprising:

forming a layer consisting essentially of silicon and germanium;

forming a mask structure on the layer to define a desired metallic region and a desired insulative region;

oxidizing the desired insulative region to form an insulative structure comprising a germanium oxide;

removing the mask structure; and substituting metal for at least a portion of the desired metallic region, thereby forming a metallic structure substantially coplanar with the insulative structure.

16. The method of claim 15, wherein forming the layer comprises depositing a silicon alloy having between 10 and 40 percent germanium.

17. The method of claim 15, wherein forming the layer comprises pyrolysis of silicon hydride and germanium hydride.

18. The method of claim 15, wherein the metal comprises an aluminum alloy.

19. The method of claim 15, wherein substituting metal for at least a portion of the desired metallic region comprises:

forming a metal layer consisting of an aluminum alloy on the desired metallic region of the layer; and heating the metal layer.

20. The method of claim 19, wherein heating the metal layer comprises:

increasing its temperature to at least 400° C.

21. The method of claim 19, wherein heating the metal layer occurs in a nitrogen, forming gas, or other non-oxidizing atmosphere.

22. The method of claim 15, further comprising forming a layer including titanium, zirconium, or hafnium on the metal layer.

23. The method of claim 15, further comprising:

reducing the dielectric constant of the insulative structure by removing at least a portion of the germanium oxide.

24. The method of claim 15, further comprising:

heating the metallic structure to a predetermined temperature for a predetermined amount of time to reduce its electrical resistivity.

25. A via-making method that does not require etching and filling a hole in an insulative layer, the method comprising:

forming a silicon-germanium layer on an integrated-circuit assembly;

oxidizing a region of the silicon-germanium layer to define a desired via region;

substituting an aluminum alloy for at least a portion of the desired via region.

26. A method of making an integrated circuit, comprising:

forming an air bridge having a conductive member;

forming a silicon-germanium layer;

oxidizing a region of the silicon-germanium layer to define a desired insulative region and a desired conductive region; and substituting metal for at least a portion of the desired conductive region to form a second conductive member electrically coupled to the conductive member of the air bridge.

27. The method of claim 26 wherein forming the air bridge comprises:

forming a support structure;

forming the conductive member on the support structure; and removing the support structure.

28. The method of claim 26 wherein forming the air bridge occurs after substituting metal for at least the portion of the desired conductive region.

* * * * *

UNITED STATES PATENT AND TRADEMARK OFFICE
CERTIFICATE OF CORRECTION

PATENT NO.: 6,121,126

DATED: Sep. 19, 2000

INVENTOR(S): Ahn et al.

It is certified that error appears in the above-identified patent and that said Letters Patent is hereby corrected as shown below:

On the Title Page, in the Assignee line, delete "Micron Technologies" and insert --Micron Technology--, therefor.

On the Title Page, in the Abstract, line 19, delete "timing-consuming" and insert --time-consuming--, therefor.

Signed and Sealed this

Eighth Day of May, 2001

*Attest:*

NICHOLAS P. GODICI

*Attesting Officer*　　　Acting Director of the United States Patent and Trademark Office